(12) United States Patent
Li (10) Patent No.: US 10,614,972 B2
(45) Date of Patent: Apr. 7, 2020

(54) RETROFIT SWITCH (71) Applicant: LEEDARSON AMERICA INC., Smyrna, GA (US)

(72) Inventor: Yongchuan Li, Smyrna, GA (US)

(73) Assignee: LEEDARSON AMERICAN INC., Smyrna, GA (US)

( * ) Notice: Subject to any disclaimer, the term of this patent is extended or adjusted under 35 U.S.C. 154(b) by 147 days.

(21) Appl. No.: 15/797,979

(22) Filed: Oct. 30, 2017

(65) Prior Publication Data

US 2019/0131082 A1 May 2, 2019

(51) Int. Cl.
| | |
|---|---|
| *H01H 9/02* | (2006.01) |
| *H01H 9/16* | (2006.01) |
| *H03K 17/96* | (2006.01) |
| *H01H 9/54* | (2006.01) |
| *H05B 37/02* | (2006.01) |

(52) U.S. Cl.
CPC ............ *H01H 9/0271* (2013.01); *H01H 9/16* (2013.01); *H01H 9/54* (2013.01); *H03K 17/96* (2013.01); *H05B 37/0272* (2013.01); *H01H 2300/03* (2013.01); *H03K 2217/94089* (2013.01); *H03K 2217/96015* (2013.01)

(58) Field of Classification Search
CPC .......... H01H 9/0271; H01H 9/16; H01H 9/54; H03K 17/96
See application file for complete search history.

(56) References Cited

U.S. PATENT DOCUMENTS

| | | | |
|---|---|---|---|
| 2016/0126031 A1* | 5/2016 | Wootton | H05B 39/02 361/211 |
| 2017/0099719 A1* | 4/2017 | Smith | F21V 23/0435 |
| 2018/0070429 A1* | 3/2018 | Lark, Jr. | H03K 17/96 |
| 2019/0042000 A1* | 2/2019 | Kasmieh | G06F 3/038 |

* cited by examiner

*Primary Examiner* — Jared Fureman
*Assistant Examiner* — Duc M Pham
(74) *Attorney, Agent, or Firm* — Chun-Ming Shih; Lanway IPR Services (57) ABSTRACT

A retrofit switch apparatus is attached to a traditional switch device. The traditional switch device has a traditional switch for accepting a first user manual operation to control a target. The retrofit switch apparatus includes an attaching device, a retrofit housing and a touch module. The attaching device is attached to the traditional switch device. The retrofit housing provides a containing space for covering the traditional switch. The touch module has a touch surface and a driver circuit. The touch surface receives a second user manual operation processed by the driver circuit.

19 Claims, 5 Drawing Sheets

RETROFIT SWITCH

FIELD OF INVENTION

The present invention relates to a retrofit switch and more particularly related to a retrofit switch capable of wirelessly controlling a target device.

BACKGROUND

IoT (Internet of Things) technologies are developed rapidly and various devices are invented for making human life more convenient. For example, wireless speakers, door locks, lights are easily controlled by a mobile phone via Bluetooth today.

Meanwhile, there are many traditional devices like lamp or downlight installed in a conventional house. It would be very helpful if certain innovative modifications are provided to turn these traditional devices into a controllable IoT network device.

SUMMARY OF INVENTION

According to a first embodiment of the invention, a retrofit switch apparatus is provided to be attached to a traditional switch device. The traditional switch device is fixed to an environment surface like a wall. The traditional switch device may also be fixed to other surface like a table, a cabin, car housing and any other devices that traditionally has traditional switch. Examples of such traditional switch includes but not limited to in-wall switches like On/Off Switches, keypads, digital switches, occupancy sensing switches, push-button switches, dimming switches such as rotary dimmers, slide dimmers, digital dimmers, and step dimmers.

Such traditional switch device has a traditional switch mounted on a traditional switch cover surface of the traditional switch device used for accepting a first user manual operation to control a target device connected to the traditional switch device with an electrical wire.

The target device may be a light, an air conditioner, a fan or any other electrical device connected to the traditional switch device with an electrical wire. In some embodiments, such electrical wire is embedded behind a wall.

The retrofit switch apparatus includes an attaching device, a retrofit housing and a touch module.

The attaching device is attached to the traditional switch cover surface. The retrofit housing is connected to the attaching device for providing a containing space for covering the traditional switch.

When the traditional switch is covered, the traditional switch is kept remaining a predetermined operation status when the attaching device is attached to the traditional switch cover surface. For example, the traditional switch may be a ON/OFF toggle switch and when the retrofit switch is attached to the traditional switch device, the traditional switch is at ON state, which means electrical power is supplied to the target device. When the retrofit switch apparatus remained attached to the traditional switch device, the traditional switch device is kept at the ON state, to prevent accidental operation of the user to turn off the power supply to the target device. If the power supply is cut off at the target device, it means the controller in the target device may also lose electricity and thus cannot respond to any control command like to turn on the target device.

a touch module supported by the retrofit housing, the touch module having a touch surface and a driver circuit, the touch surface being for receiving a second user manual operation processed by the driver circuit, wherein the second user manual operation is associated with the function of the first user manual operation, wherein the touch surface of the touch module has a movable connection and the retrofit housing having a detachable connection and the driver circuit providing a wireless control to the target device.

In some embodiments, the touch module is detachable from the retrofit housing to form the movable connection. In other words, the touch module may be separated from the retrofit housing. Certain connector structure may be used to attach the touch module to the retrofit housing while keep the touch module removable from the retrofit housing.

In some embodiments, the touch module has a battery box and the opening of the battery box is hidden when the touch module is fit in the retrofit housing. To replace the battery of the touch module, the touch opening of the battery box need to be exposed to the user. For example, the touch module is separated from the retrofit housing to replace its battery.

In some embodiments, the touch module is connected with the retrofit housing via a rotatable axis. In such design, the touch module only needs to be rotated with respect to the retrofit housing to expose the battery box for replacing a battery of the touch module. Please b noted that the battery box does not mean complete enclosing structure an may refer to any container that contains one or more batteries.

In some embodiments, the touch surface may have a display showing a control interface associated to the traditional switch. In other words, the touch surface may be a display at the same time while disposing a touch sensor layer on the touch surface.

In some embodiments, the attaching device may have a surface part, a mounting part, and a connector part. The surface part is fixed on the traditional switch cover surface. For example, the surface part may be a bracket using glue or screws to fix on the traditional switch cover surface. On the other hand, the mounting part is fixed to the mechanical switch, which means being connected to the mechanical switch portion directly or indirectly. Overall, the mounting part and the surface part have a detachable connection via the connector part. In other words, the mounting part and the surface part may be separated. When needed, the mounting part and the surface part may be assembled together again via the connector part. The connector party may have two corresponding units respectively disposed on the surface part and the mounting part. Other structure that may connect two parts may also be used as the connector part mentioned here.

In some embodiments, the connector part may include magnet components and using magnetic force to keep the mounting part and the surface together while remaining possibility to separate the mounting part and the surface part with certain force applying thereon. It is useful if we can keep the traditional switch to remained turning on electrical power to the target device to keep the control circuit in the target device function normally, but it is also useful if we can keep the user an option to temporarily operate the traditional switch. For example, if the user wants to replace a bulb in the target device and the power is kept turning on because the traditional switch is hidden and kept that mode, it may cause certain undesired danger. In addition, there is chance that the retrofit switch apparatus may not function normally. When this happens, it is very helpful to allow the user to use original traditional switch to get things done, instead of the need to find a screw driver just to expose the traditional switch to operate.

In some other embodiments, the attaching device may include a rotatable axis for providing a first mode and a second mode. The traditional switch is covered by the retrofit housing and kept untouchable from a user in the first mode. A part of the retrofit housing is rotated with respect to the traditional switch along the rotatable axis to expose the traditional switch to the user in the second mode for the user to operate the traditional switch. In other words, the user may uncover and use the traditional switch just like opening a book along the rotating the rotatable axis. The rotatable axis may be regarded as an option to implement the connector part as mentioned above.

In addition, the retrofit switch apparatus may include a battery box. The battery box is used for holding a battery for supplying power to the wireless controller. The battery box is exposed to the user in the second mode so that the user may replace a battery in the battery box easily.

In some embodiments, the attaching device may include a sucker unit using air pressure to attach the retrofit housing upon the traditional switch. Such sucker unit may be made of elastic plastic with an opening and an air space. Users may press the opening to the traditional switch surface cover to press air out of the air space so that the opening have a sucking force to keep the retrofit switch apparatus to the traditional switch device to be fixed together. Such mechanism is helpful when the traditional switch surface is smooth and such method provides a convenient and easy installation of the retrofit switch apparatus. More than one sucker units may be used to enhance attachment reliability.

In some embodiments, the attaching device may include an adhesive tape using glue to attach the retrofit housing upon the traditional switch. More than one ways may also be applied at the same time.

For some traditional switches, they have corresponding display to show certain status. In such case, a display window may be disposed on the retrofit housing. Specifically, the traditional switch device has a display showing a status of the target device, and the display window shows the status. The display window may be an opening to expose the display of the traditional switch device. Alternatively, the display window may also be an electronic display driven by the wireless controller to shows the status.

In some embodiments, the wireless controller may also drive a visual indicator like a display or LED indicators to show working status to the user. For example, the indicator may show whether the wireless controller is successfully communicating and controlling the target device, or the battery is in low status.

In some embodiments, the visual indicator changes appearance, like showing different colors or different lighting patterns, to give a feedback to a user when the user is operating the retrofit switch apparatus. This is helpful to be a more effective and friendly user interface.

In some embodiments, the wireless controller may use an audio indicator, like a speaker, for generating sound in response to the second user manual operation. For example, certain sound effects may be helpful to assist the user to operate the retrofit switch apparatus and get better user experience.

In some embodiments, the traditional switch may be an on/off toggle switch, a push button switch, a rotary dimmer or a step dimmer. Other types of traditional switches may be implemented when needed. The mechanic switch of the retrofit switch apparatus may have the same shape as the associated traditional switch or have similar or different shapes as the associated traditional switch once the mechanical switch is capable of performing the same or more function compared with the associated traditional switch.

In some embodiments, the driver circuit is located under but aside the touch surface, not necessary to be placed right below the touch surface. Such design may help decrease the thickness of the overall retrofit switch apparatus.

In some embodiments, the retrofit switch apparatus is not electrically connected to the traditional switch device. But, in some other embodiments, the retrofit switch apparatus may also be configured to receive power supply from the traditional switch device. In such case, it would be easier for the user because the user does not need to worry to recharge or replace a battery for the retrofit switch apparatus.

The retrofit housing may have any desired shapes. For example, the retrofit housing may have shape of a square box, a circular disk or any shapes.

DETAILED DESCRIPTION

Figure 1:
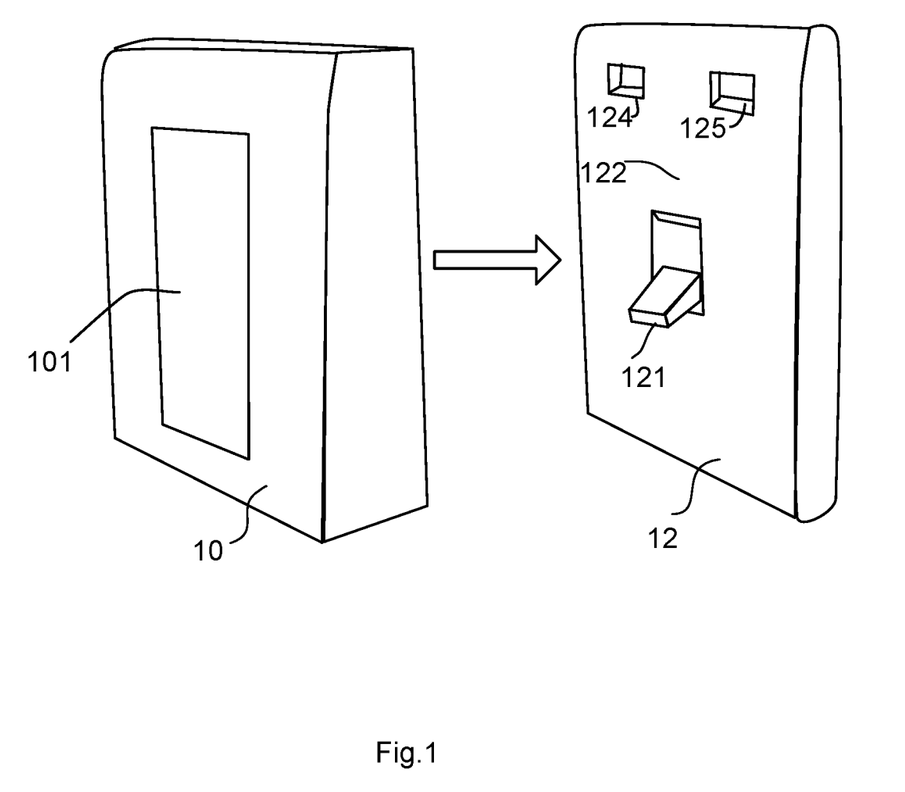
FIG. 1 illustrates attaching a retrofit switch apparatus to a traditional switch device.

Please refer to FIG. 1, which illustrates a retrofit switch apparatus 10 be attached to a traditional switch device 12. traditional switch device. The traditional switch device 12 is fixed to an environment surface like a wall. The traditional switch 12 has a traditional switch 121 on a traditional switch surface cover 122. The retrofit switch apparatus 10 has a touch module 101 showing a touch surface for receiving user operations thereon.

The traditional switch device may also be fixed to other surface like a table, a cabin, car housing and any other devices that traditionally has traditional switch. Examples of such traditional switch includes but not limited to in-wall switches like On/Off Switches, keypads, digital switches, occupancy sensing switches, push-button switches, dimming switches such as rotary dimmers, slide dimmers, digital dimmers, and step dimmers.

Such traditional switch device has a traditional switch mounted on a traditional switch cover surface of the traditional switch device used for accepting a first user manual operation to control a target device connected to the traditional switch device with an electrical wire.

The target device may be a light, an air conditioner, a fan or any other electrical device connected to the traditional switch device with an electrical wire. In some embodiments, such electrical wire is embedded behind a wall.

Figure 2:
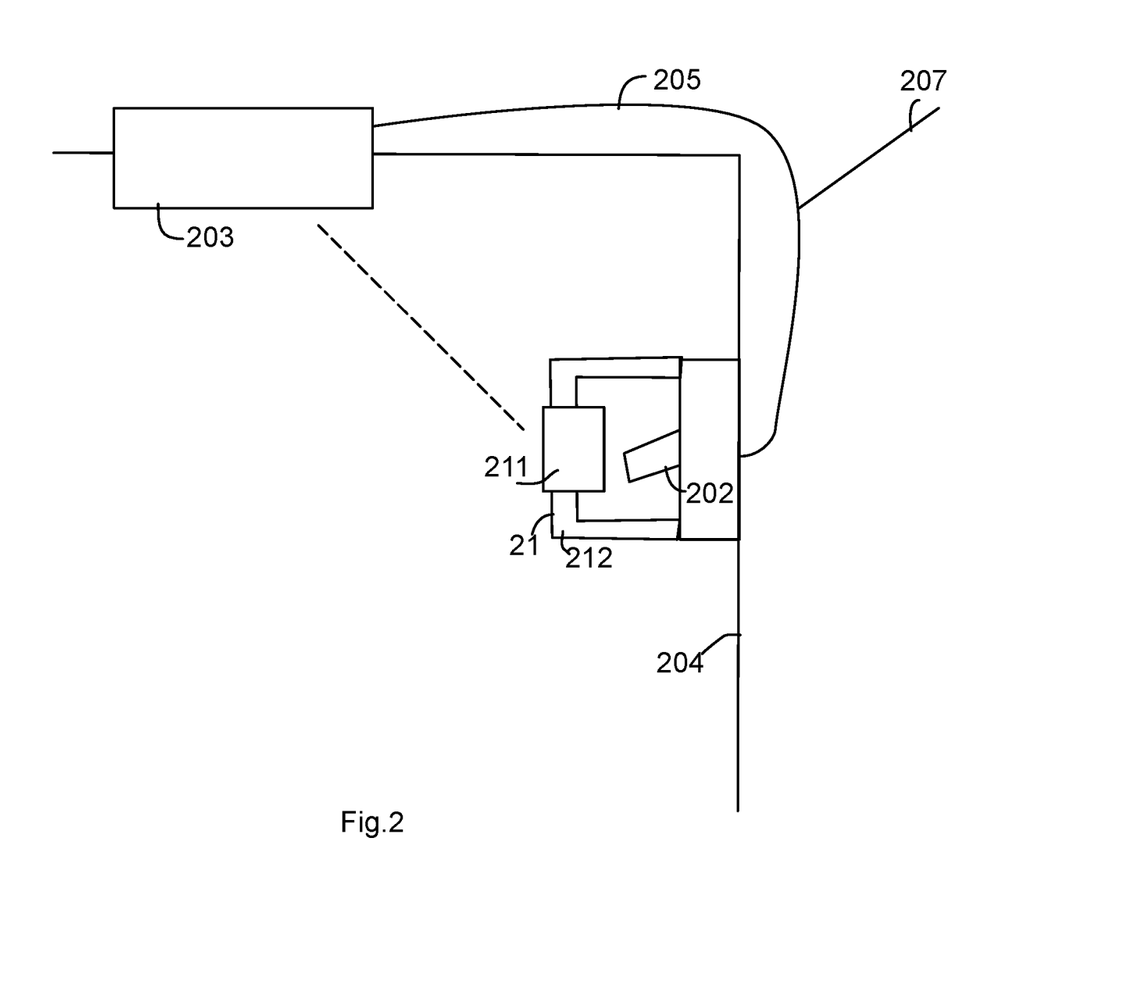
FIG. 2 illustrates relation between a switch and a target device.

Please refer to FIG. 2, which illustrates connection between components of an embodiment. A traditional switch device 202 is connected to a target device 203 via a wire 206 which is further electrically connected to a power source 207. The traditional switch 202 may be used to turn on or turn off the target device by opening or closing an electrical current loop to the power source 207. When a retrofit switch apparatus 21 is attached to the traditional switch device 202, the traditional switch 202 is covered in a containing space defined by a retrofit housing 212. A touch module 211 is connected to the retrofit housing 212 for receiving user touch operation and a wireless controller is used for controlling the target device 203. The wireless controller may be integrated with a touch driver to provide touch and control functions.

The retrofit switch apparatus includes an attaching device, a retrofit housing and a touch module.

The attaching device is attached to the traditional switch cover surface. The retrofit housing is connected to the attaching device for providing a containing space for covering the traditional switch.

When the traditional switch is covered, the traditional switch is kept remaining a predetermined operation status when the attaching device is attached to the traditional switch cover surface. For example, the traditional switch may be a ON/OFF toggle switch and when the retrofit switch is attached to the traditional switch device, the traditional switch is at ON state, which means electrical power is supplied to the target device. When the retrofit switch apparatus remained attached to the traditional switch device, the traditional switch device is kept at the ON state, to prevent accidental operation of the user to turn off the power supply to the target device. If the power supply is cut off at the target device, it means the controller in the target device may also lose electricity and thus cannot respond to any control command like to turn on the target device.

A touch module is supported by the retrofit housing. The touch module has a touch surface and a driver circuit. The touch surface is used for receiving a second user manual operation processed by the driver circuit. The second user manual operation is associated with the function of the first user manual operation.

The touch surface of the touch module has a movable connection and the retrofit housing having a detachable connection and the driver circuit providing a wireless control to the target device.

Figure 3:
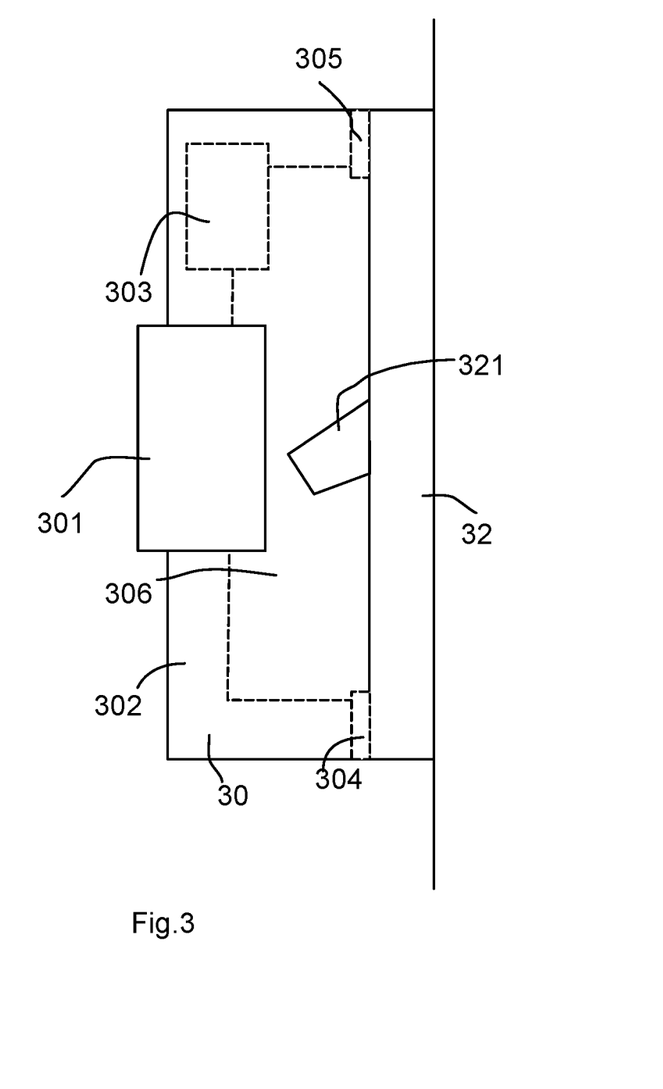
FIG. 3 illustrates a cross section view of a retrofit switch apparatus.

Please refer to FIG. 3, which illustrates an example of a retrofit switch apparatus 30 covering a traditional switch device 32. A traditional switch 321 is covered in a containing space 306 of the retrofit housing 302. A touch module 301 is connected to the retrofit housing 302. Related driver circuit and control circuit 303 may be placed aside, not right below the main body of touch module 301, e.g. under the touch surface of the touch module 301. Attaching devices 304, 305 are used to attaching the retrofit housing 302 to the traditional switch device 32.

Figure 4A:
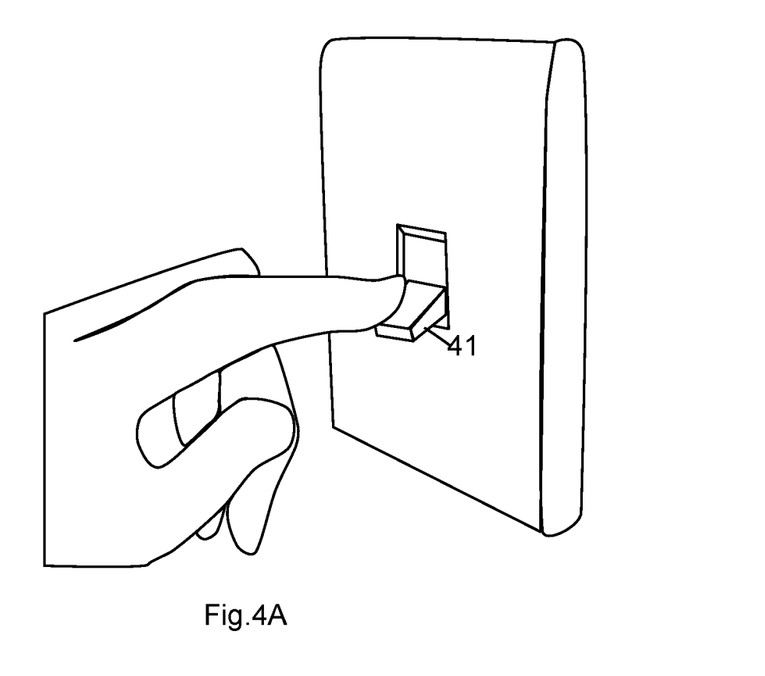
FIG. 4A and FIG. 4B illustrates use scenarios of a traditional switch device and a retrofit switch apparatus.
Figure 4B:
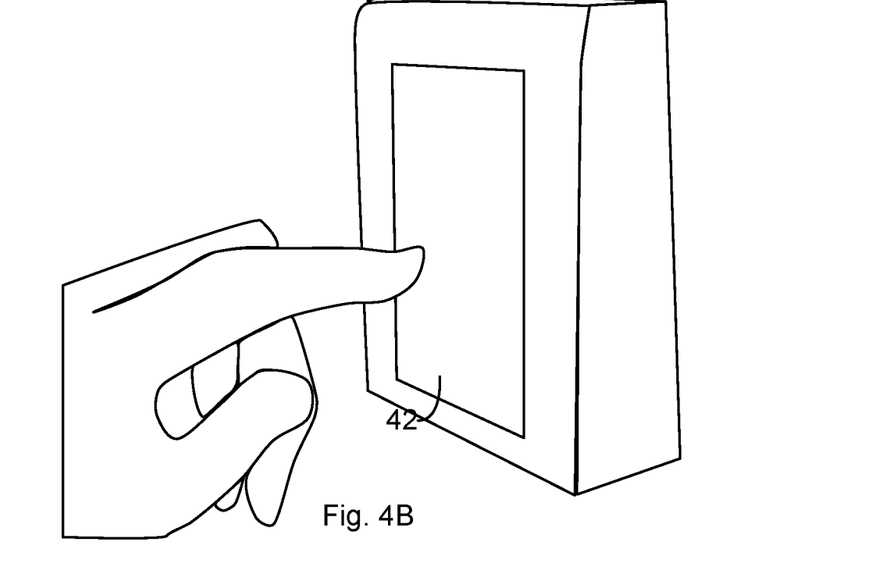

Please refer to FIG. 4A and FIG. 4B, which illustrate difference between operating a traditional switch 41 and operating a touch surface 42. In this example, when the retrofit switch apparatus is attached on the traditional switch device, the traditional switch is hidden from the user and would not be operated by accident.

In some embodiments, the touch module is detachable from the retrofit housing to form the movable connection. In other words, the touch module may be separated from the retrofit housing. Certain connector structure may be used to attach the touch module to the retrofit housing while keep the touch module removable from the retrofit housing.

In some embodiments, the touch module has a battery box and the opening of the battery box is hidden when the touch module is fit in the retrofit housing. To replace the battery of the touch module, the touch opening of the battery box need to be exposed to the user. For example, the touch module is separated from the retrofit housing to replace its battery.

In some embodiments, the touch module is connected with the retrofit housing via a rotatable axis. In such design, the touch module only needs to be rotated with respect to the retrofit housing to expose the battery box for replacing a battery of the touch module. Please b noted that the battery box does not mean complete enclosing structure an may refer to any container that contains one or more batteries.

In some embodiments, the touch surface may have a display showing a control interface associated to the traditional switch. In other words, the touch surface may be a display at the same time while disposing a touch sensor layer on the touch surface.

In some embodiments, the attaching device may have a surface part, a mounting part, and a connector part. The surface part is fixed on the traditional switch cover surface. For example, the surface part may be a bracket using glue or screws to fix on the traditional switch cover surface. On the other hand, the mounting part is fixed to the mechanical switch, which means being connected to the mechanical switch portion directly or indirectly. Overall, the mounting part and the surface part have a detachable connection via the connector part. In other words, the mounting part and the surface part may be separated. When needed, the mounting part and the surface part may be assembled together again via the connector part. The connector party may have two corresponding units respectively disposed on the surface part and the mounting part. Other structure that may connect two parts may also be used as the connector part mentioned here.

In some embodiments, the connector part may include magnet components and using magnetic force to keep the mounting part and the surface together while remaining possibility to separate the mounting part and the surface part with certain force applying thereon. It is useful if we can keep the traditional switch to remained turning on electrical power to the target device to keep the control circuit in the target device function normally, but it is also useful if we can keep the user an option to temporarily operate the traditional switch. For example, if the user wants to replace a bulb in the target device and the power is kept turning on because the traditional switch is hidden and kept that mode, it may cause certain undesired danger. In addition, there is chance that the retrofit switch apparatus may not function normally. When this happens, it is very helpful to allow the user to use original traditional switch to get things done, instead of the need to find a screw driver just to expose the traditional switch to operate.

In some other embodiments, the attaching device may include a rotatable axis for providing a first mode and a second mode. The traditional switch is covered by the retrofit housing and kept untouchable from a user in the first mode. A part of the retrofit housing is rotated with respect to the traditional switch along the rotatable axis to expose the traditional switch to the user in the second mode for the user to operate the traditional switch. In other words, the user may uncover and use the traditional switch just like opening a book along the rotating the rotatable axis. The rotatable axis may be regarded as an option to implement the connector part as mentioned above.

In addition, the retrofit switch apparatus may include a battery box. The battery box is used for holding a battery for supplying power to the wireless controller. The battery box is exposed to the user in the second mode so that the user may replace a battery in the battery box easily.

Figure 5:
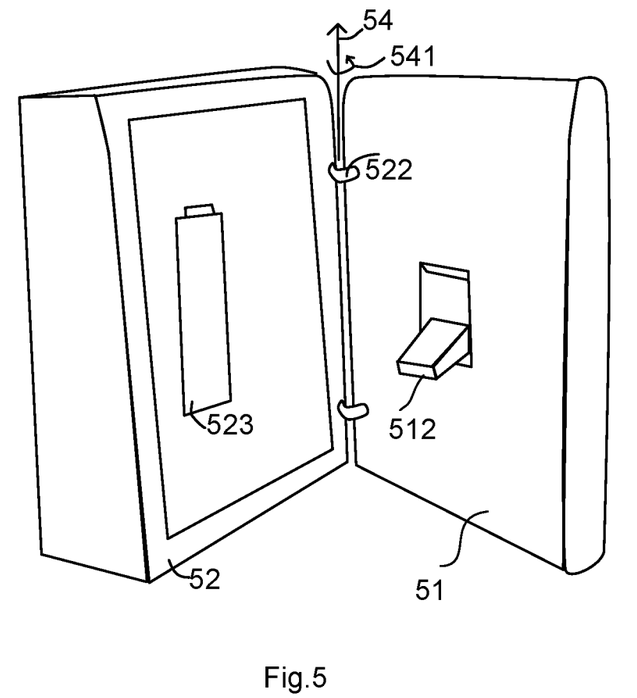
FIG. 5 illustrates a retrofit switch apparatus rotated with respect to a traditional switch device.

Please refer to FIG. 5, which illustrates a diagram in which a retrofit switch apparatus 52 is rotated with respect to a traditional switch device 51. The retrofit switch 52 has an attaching device 522 that defines a rotating axis 54. When the retrofit switch 52 is rotated with respect to the traditional switch apparatus 51 along the rotation direction 541, the traditional switch 512 may be exposed to be used again. In addition, a battery box of the retrofit switch apparatus 52 may be exposed and user may replace a battery 523 to power the wireless controller of the retrofit switch apparatus 52.

In some embodiments, the attaching device may include a sucker unit using air pressure to attach the retrofit housing upon the traditional switch. Such sucker unit may be made of elastic plastic with an opening and an air space. Users may press the opening to the traditional switch surface cover to press air out of the air space so that the opening have a sucking force to keep the retrofit switch apparatus to the traditional switch device to be fixed together. Such mechanism is helpful when the traditional switch surface is smooth and such method provides a convenient and easy installation of the retrofit switch apparatus. More than one sucker units may be used to enhance attachment reliability.

In some embodiments, the attaching device may include an adhesive tape using glue to attach the retrofit housing upon the traditional switch. More than one ways may also be applied at the same time.

For some traditional switches, they have corresponding display to show certain status. In such case, a display window may be disposed on the retrofit housing. Specifically, the traditional switch device has a display showing a status of the target device, and the display window shows the status. The display window may be an opening to expose the display of the traditional switch device. Alternatively, the display window may also be an electronic display driven by the wireless controller to shows the status.

In some embodiments, the wireless controller may also drive a visual indicator like a display or LED indicators to show working status to the user. For example, the indicator may show whether the wireless controller is successfully communicating and controlling the target device, or the battery is in low status.

In some embodiments, the visual indicator changes appearance, like showing different colors or different lighting patterns, to give a feedback to a user when the user is operating the retrofit switch apparatus. This is helpful to be a more effective and friendly user interface.

In some embodiments, the wireless controller may use an audio indicator, like a speaker, for generating sound in response to the second user manual operation. For example, certain sound effects may be helpful to assist the user to operate the retrofit switch apparatus and get better user experience.

In some embodiments, the traditional switch may be an on/off toggle switch, a push button switch, a rotary dimmer or a step dimmer. Other types of traditional switches may be implemented when needed. The mechanic switch of the retrofit switch apparatus may have the same shape as the associated traditional switch or have similar or different shapes as the associated traditional switch once the mechanical switch is capable of performing the same or more function compared with the associated traditional switch.

In some embodiments, the driver circuit is located under but aside the touch surface, not necessary to be placed right below the touch surface. Such design may help decrease the thickness of the overall retrofit switch apparatus.

In some embodiments, the retrofit switch apparatus is not electrically connected to the traditional switch device. But, in some other embodiments, the retrofit switch apparatus may also be configured to receive power supply from the traditional switch device. In such case, it would be easier for the user because the user does not need to worry to recharge or replace a battery for the retrofit switch apparatus.

The retrofit housing may have any desired shapes. For example, the retrofit housing may have shape of a square box, a circular disk or any shapes.

It is to be understood that the forms of the invention shown are preferred embodiments thereof and that various changes and modifications may be made therein without departing from the spirit of the invention or scope as defined in the following claims.

The invention claimed is:

1. A retrofit switch apparatus for being attached to a traditional switch device, the traditional switch device being fixed to an environment surface and having a traditional switch mounted on a traditional switch cover surface of the traditional switch device used for accepting a first user manual operation to control a target device connected to the traditional switch device with an electrical wire, the retrofit switch apparatus comprising:

an attaching device for attaching to the traditional switch cover surface;

a retrofit housing connected to the attaching device for providing a containing space for covering the traditional switch so as to keep the traditional switch remaining a predetermined operation status when the attaching device being attached to the traditional switch cover surface; and a touch module supported by the retrofit housing, the touch module having a touch surface and a driver circuit, the touch surface being for receiving a second user manual operation processed by the driver circuit, wherein the second user manual operation is associated with the function of the first user manual operation, wherein the touch surface of the touch module has a movable connection and the retrofit housing having a detachable connection and the driver circuit providing a wireless control to the target device, wherein the attaching device comprises a rotatable axis for providing a first mode and a second mode, the traditional switch is covered by the retrofit housing and kept untouchable from a user in the first mode, and a part of the retrofit housing is rotated with respect to the traditional switch along the rotatable axis to expose the traditional switch to the user in the second mode for the user to operate the traditional switch.

2. The retrofit switch apparatus of claim 1, wherein the touch module is detachable from the retrofit housing to form the movable connection.

3. The retrofit switch apparatus of claim 1, wherein the touch module has a battery box and the opening of the battery box is hidden when the touch module is fit in the retrofit housing.

4. The retrofit switch apparatus of claim 1, wherein the touch module is connected with the retrofit housing via a rotatable axis, the touch module is rotated with respect to the retrofit housing for replacing a battery of the touch module.

5. The retrofit switch apparatus of claim 1, wherein the touch surface having a display showing a control interface associated to the traditional switch.

6. The retrofit switch apparatus of claim 1, wherein the attaching device having a surface part, a mounting part, and a connector part, the surface part is fixed on the traditional switch cover surface, the mounting part fixed to the mechanical switch, and the mounting part and the surface part have a detachable connection via the connector part.

7. The retrofit switch apparatus of claim 6, wherein the connector part comprises magnet component for performing the detachable connection.

8. The retrofit switch apparatus of claim 1, further comprising a battery box exposed to the user in the second mode for the user to replace a battery in the battery box.

9. The retrofit switch apparatus of claim 1, wherein the attaching device comprises a sucker unit using air pressure to attach the retrofit housing upon the traditional switch.

10. The retrofit switch apparatus of claim 1, wherein the attaching device comprising an adhesive tape using glue to attach the retrofit housing upon the traditional switch.

11. The retrofit switch apparatus of claim 1, further comprising a display window, wherein the traditional switch device has a display showing a status of the target device, the display window showing the status.

12. The retrofit switch apparatus of claim 11, wherein the display window is driven by the wireless controller to shows the status.

13. The retrofit switch apparatus of claim 12, wherein the display window is an opening showing the status of the traditional switch device to a user.

14. The retrofit switch apparatus of claim 1, wherein the wireless controller has a visual indicator showing a working status to a user.

15. The retrofit switch apparatus of claim 14, wherein the visual indicator changes appearance in response to the second user manual operation.

16. The retrofit switch apparatus of claim 1, wherein the wireless controller has an audio indicator for generating sound in response to the second user manual operation.

17. The retrofit switch apparatus of claim 1, wherein the traditional switch is an on/off toggle switch.

18. The retrofit switch apparatus of claim 1, wherein the driver circuit is located under but aside the touch surface.

19. The retrofit switch apparatus of claim 1, wherein the driver circuit receives electrical power from the traditional switch device.

* * * * *